United States Patent
Nakamura

(10) Patent No.: US 10,498,996 B2
(45) Date of Patent: Dec. 3, 2019

(54) PIXEL CONTROL SIGNAL VERIFICATION IN A STACKED IMAGE SENSOR

(71) Applicant: SEMICONDUCTOR COMPONENTS INDUSTRIES, LLC, Phoenix, AZ (US)

(72) Inventor: Kei Nakamura, Kanagawa (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 63 days.

(21) Appl. No.: 16/014,205

(22) Filed: Jun. 21, 2018

(65) Prior Publication Data

US 2019/0149758 A1    May 16, 2019

Related U.S. Application Data

(60) Provisional application No. 62/585,698, filed on Nov. 14, 2017.

(51) Int. Cl.
| | |
|---|---|
| *H04N 5/376* | (2011.01) |
| *H04N 17/00* | (2006.01) |
| *H01L 27/146* | (2006.01) |
| *H01L 25/16* | (2006.01) |
| *H04N 5/3745* | (2011.01) |

(52) U.S. Cl.
CPC .......... *H04N 5/376* (2013.01); *H01L 25/167* (2013.01); *H01L 27/14643* (2013.01); *H04N 5/3745* (2013.01); *H04N 17/002* (2013.01)

(58) Field of Classification Search
CPC ....................................................... H04N 5/376
USPC ................................................. 348/294, 308
See application file for complete search history.

(56) References Cited

U.S. PATENT DOCUMENTS

2013/0308029 A1* 11/2013 Yaghmai .............. H04N 5/3745
                                                                       348/302

* cited by examiner

*Primary Examiner* — Joel W Fosselman
(74) *Attorney, Agent, or Firm* — Treyz Law Group, P.C.; Joseph F. Guihan

(57) ABSTRACT

An image sensor may be formed from stacked first and second substrates. An array of imaging pixels that each have a photodiode and accompanying transistors may be formed in the first substrate. Verification circuitry may also be formed in the first substrate. Row control circuitry may be formed in the second substrate. The row control circuitry may provide row control signals to the array of imaging pixels. The verification circuitry may also receive the row control signals from the row control circuitry. The first substrate may include a plurality of n-channel metal-oxide semiconductor transistors and may not include any p-channel metal-oxide semiconductor transistors. The second substrate may also include a p-channel metal-oxide semiconductor current source coupled to the verification circuitry. Only the verification circuitry portions that are enabled by control signals from the row control circuitry may receive current from the current source.

20 Claims, 5 Drawing Sheets

PIXEL CONTROL SIGNAL VERIFICATION IN A STACKED IMAGE SENSOR

This application claims benefit of and claims priority to provisional patent application No. 62/585,698, filed Nov. 14, 2017, which is hereby incorporated by reference herein in its entirety.

BACKGROUND

This relates generally to image sensors, and more specifically, to methods and circuitry for testing the integrity of the components in the image sensor.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include an array of image sensor pixels each of which includes a photodiode and other operational circuitry such as transistors formed in the substrate.

Over the lifetime of an electronic device, image sensors in the electronic device may be prone to failure. Conventional image sensors are sometimes provided with methods and circuitry for testing the functionality of the image sensor. However, including circuitry for testing the functionality of the image sensor may lead to a complex manufacturing process for the image sensor. Additionally, in conventional image sensors, a single semiconductor substrate is used for the image sensor. This may reduce the amount of space available for the pixel photodiodes.

It would therefore be desirable to be able to provide improved image sensors that include circuitry for testing the functionality of the image sensor.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
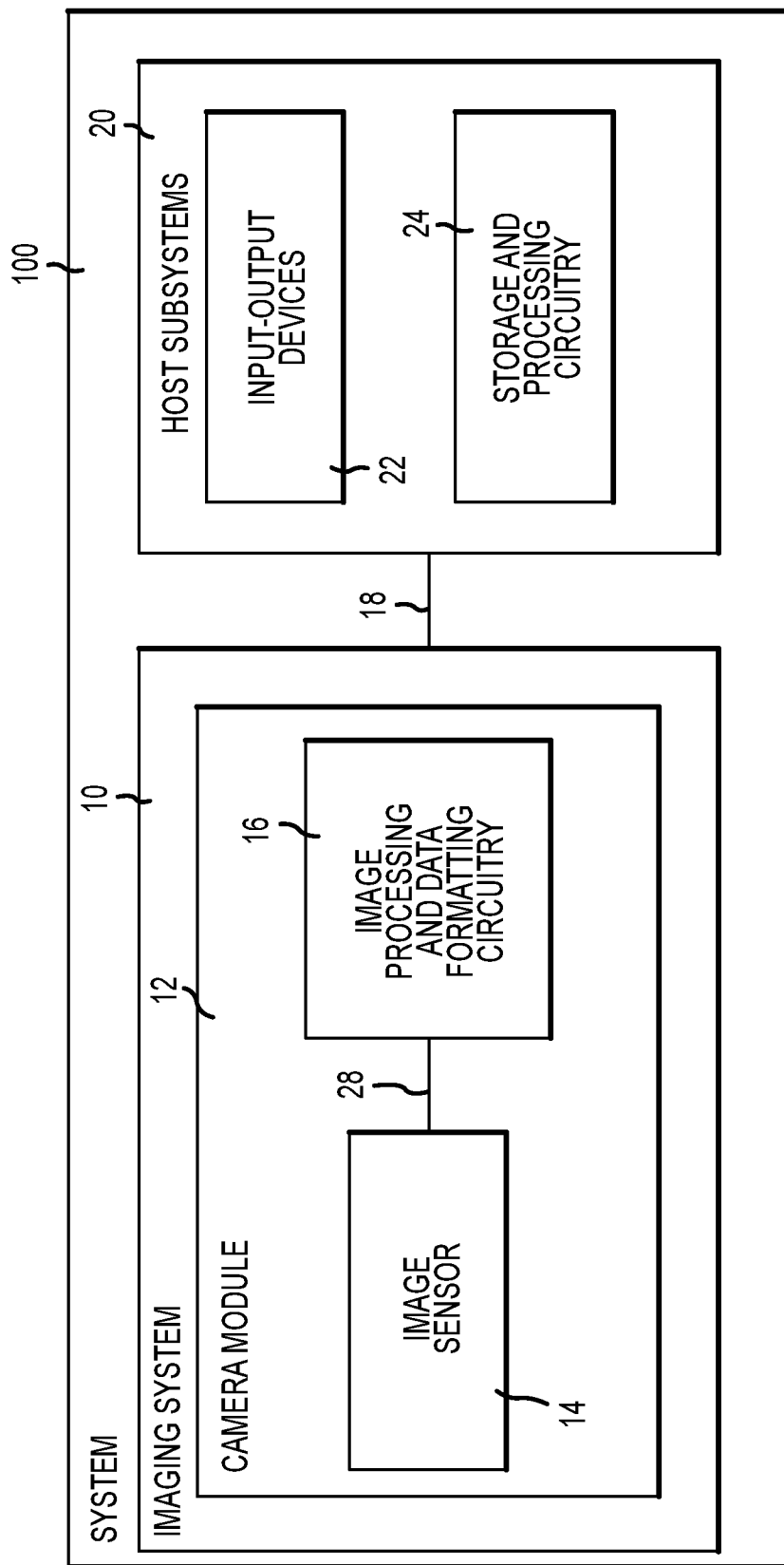
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

System 100 may be a vehicle safety system. In a vehicle safety system, images captured by the image sensor may be used by the vehicle safety system to determine environmental conditions surrounding the vehicle. As examples, vehicle safety systems may include systems such as a parking assistance system, an automatic or semi-automatic cruise control system, an auto-braking system, a collision avoidance system, a lane keeping system (sometimes referred to as a lane drift avoidance system), a pedestrian detection system, etc. In at least some instances, an image sensor may form part of a semi-autonomous or autonomous self-driving vehicle. Vehicle safety standards may require that the proper operation of any component of a vehicle safety system (including the image sensor) be verified before, during, and/or after operation of the vehicle. Verification operations for the image sensor may be performed by the imaging system prior to, during, and/or after operation of a vehicle (e.g., upon startup and/or shutdown of the imaging system).

Figure 2:
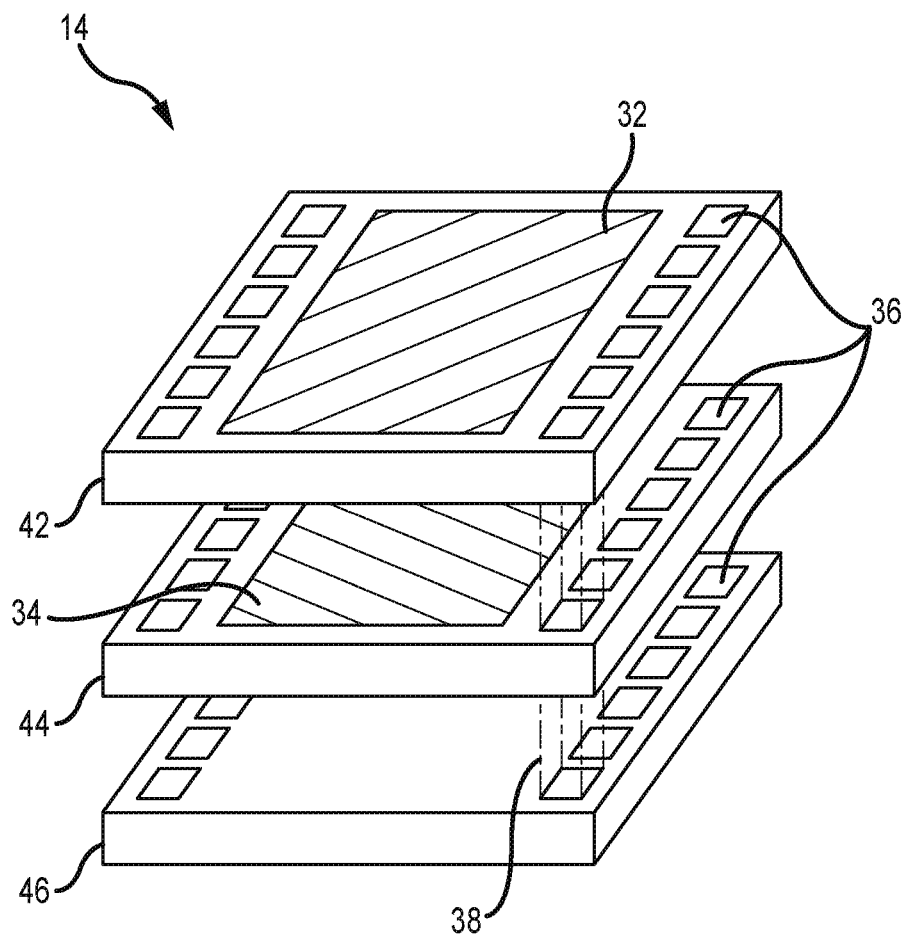
FIG. 2 is a perspective view of an illustrative image sensor formed using stacked substrates in accordance with an embodiment.

If desired, image sensor 14 may be implemented using a single semiconductor substrate. Alternatively, image sensor 14 may be implemented in a stacked-die arrangement. In the stacked-die arrangement, pixels may be formed in a substrate and readout circuitry may be formed in a separate substrate. The pixels may optionally be split between two substrates. The substrate layers may be layers of semiconductor material such as silicon. The substrate layers may be connected using metal interconnects. An example is shown in FIG. 2 in which substrates 42, 44, and 46 are used to form image sensor 14. Substrates 42, 44 and 46 may sometimes be referred to as chips. Upper chip 42 may contain the photodiodes in pixel array 32. Charge transferring transistor gates (e.g., transfer transistor 58 in FIG. 4) may also be included in upper chip 42. However, to ensure that there is adequate room for the photodiodes in upper chip 42, much of the circuitry for the image sensor may be formed in middle chip 44 and lower chip 46.

Middle chip 44 may be bonded to upper chip 42 with an interconnect layer at every pixel. For example, pixel circuitry 34 in middle chip 44 may be bonded to a Floating Diffusion (FD) that is connected to a charge transfer transistor formed in upper chip 42. Bonding each pixel in upper chip 42 to corresponding pixel circuitry in middle chip 44 (e.g., floating diffusion to floating diffusion) may be referred to as hybrid bonding. Middle chip 44 and lower chip 46 may not be coupled with hybrid bonding. Only peripheral electrical contact pads 36 of each chip may be bonded together (e.g., chip-to-chip connections 38). Each chip in image sensor 14 may include relevant circuitry. The upper chip may contain photodiodes and charge transferring transistor gates. The middle chip may include pixel circuitry (e.g., floating diffusion node, source follower transistor, reset transistor, etc.). The bottom chip 46 (sometimes referred to as an ASIC chip) may include one or more of clock generating circuits, pixel addressing circuits, signal processing circuits such as correlated double sampling (CDS) circuits, analog to digital converter circuits, digital image processing circuits, system interface circuits, clamp input generator circuits, clamp transistors, and clamp circuitry.

The example shown in FIG. 2 is merely illustrative. As previously mentioned, in another embodiment the image sensor may include two substrates. In this embodiment, the first substrate may include photodiodes, charge transferring transistor gates, and pixel circuitry (e.g., floating diffusion node, source follower transistor, reset transistor, etc.). The second substrate (e.g., the ASIC chip) may include one or more of clock generating circuits, pixel addressing circuits, signal processing circuits such as CDS circuits, analog to digital converter circuits, digital image processing circuits, system interface circuits, clamp input generator circuits, clamp transistors, and clamp circuitry.

Figure 3:
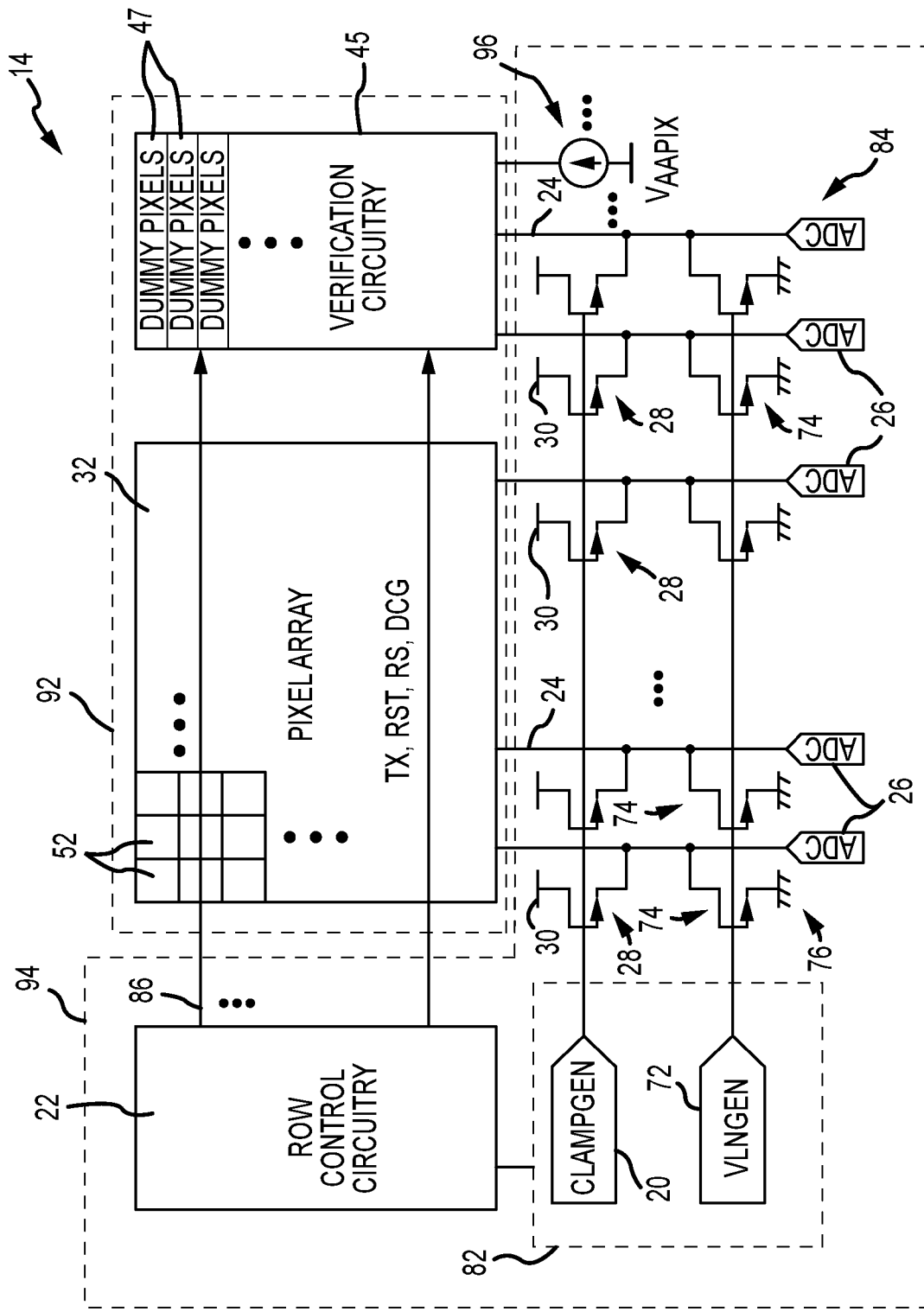
FIG. 3 is a diagram of an illustrative image sensor with a pixel array and verification circuitry formed in a first substrate and readout circuitry formed in a second substrate in accordance with an embodiment.

FIG. 3 shows an illustrative image sensor 14 that includes multiple substrates and verification circuitry. Image sensor 14 includes a pixel array such as array 32 of pixels 52 (sometimes referred to herein as image sensor pixels, imaging pixels, or image pixels 52). Image sensor 14 may sense light by converting impinging photons into electrons or holes that are integrated (collected) in sensor pixels in pixel array 32. After completion of the integration cycle, collected charge may be converted into a voltage, which may be supplied to the output terminals of image sensor 14. After charge to voltage conversion is completed and the resulting signal transferred out from the pixels, the pixels of image sensor 14 may be reset in order to be ready to accumulate new charge. In certain embodiments, pixels may use a floating diffusion region (FD) as a charge detection node. When a floating diffusion node is used, the reset may be accomplished by turning on a reset transistor that conductively connects the FD node to a voltage reference, which may be the pixel SF drain node.

As shown in FIG. 3, image sensor 14 may also include row control circuitry 22 (sometimes referred to as a row decoder/driver). Row control circuitry 22 may send control signals to pixel array 32 (e.g., over control lines 86) to control operation of pixels in pixel array 32. For example, row control circuitry 22 may send a transfer control signal (TX), a reset control signal (RST), a row select control signal (RS), and/or a dual conversion gain control signal (DCG) to pixel array 32 and/or verification circuitry 45 using control lines 86. The transfer control signal may be provided to a transfer transistor in each pixel in a given row. The reset control signal may be provided to a reset transistor in each pixel in a given row. The row select control signal may be provided to a row select transistor in each pixel in a given row. The dual conversion gain control signal may be provided to a dual conversion gain control transistor in each pixel in a given row.

Each pixel in pixel array 32 may be coupled to a corresponding column line 24. Each column line may be coupled to every pixel in a respective column of the pixel array. During operation of pixel array 32, the pixels may output the voltage that is based on the amount of light collected during the integration cycle onto column line 24 (sometimes referred to as column output line 24). Each column line 24 is coupled to a respective analog-to-digital converter (ADC) 26. The analog-to-digital converters are used to convert the voltage received from the column output line into a digital signal. Analog-to-digital converters 26 may be analog ground referred analog-to-digital converters.

In some cases, as shown in FIG. 3, the image sensor includes clamp transistors. Clamp transistors 28 may be coupled between column output line 24 and a bias voltage supply terminal 30. Bias voltage supply terminal 30 may supply a bias voltage such as $V_{AAPIX}$ or another desired bias voltage. In the example of FIG. 3, clamp transistors 28 are n-channel metal-oxide semiconductor (nMOS) transistors with a drain terminal coupled to bias voltage supply terminal 30 and a source terminal coupled to column output line 24. The gate of each clamp transistor may receive a signal from clamp input generator 20. Clamp input generator 20 may output either a ground referred clamp input or a power supply referred clamp input. During normal imaging operations (when pixel array 32 is used to collect light during integration cycles), clamp input generator 20 may output a power supply referred clamp input that is generated in reference to the power supply voltage (e.g., $V_{AAPIX}$). During testing operations (sometimes referred to as verification operations), clamp input generator 20 may output a ground referred clamp input that is generated in reference to analog ground. In some cases, using the analog ground referred clamp input may ensure high precision test inputs during testing operations.

The image sensor of FIG. 3 may also include a VLN signal generator 72 that generates a corresponding VLN signal. The VLN signal is provided to the gates of VLN transistors 74. In the example of FIG. 3, VLN transistors 74 are n-channel metal-oxide semiconductor (nMOS) transistors with a drain terminal coupled to column output line 24 and a source terminal coupled to ground 76. VLN transistors 74 and VLN signal generator 72 may form nMOS current sources used during readout and testing of pixels in the image sensor.

VLN signal generator 72 and clamp input generator 20 may be part of control and processing circuitry 82. Analog-to-digital converters 26, clamp transistors 28, and VLN transistors 74 may be considered part of column control and readout circuitry 84. Control and processing circuitry 82 may correspond to image processing and data formatting circuitry 16 in FIG. 1. Control and processing circuitry 82 may be coupled to row control circuitry 22 and may be coupled to column control and readout circuitry 84. Row control circuitry 22 may receive row addresses from control and processing circuitry 82 and may supply corresponding row control signals (e.g., TX, RST, RS, DCG) to image pixels in pixel array 32 over control paths 86 (e.g., dual conversion gain control signals, pixel reset control signals, charge transfer control signals, blooming control signals, row select control signals, or any other desired pixel control signals). Column control and readout circuitry 84 may be coupled to the columns of pixel array 32 via the column lines 24. Column lines 24 may be used for reading out image signals from image pixels and for supplying bias signals (e.g., bias currents or bias voltages) to image pixels. During image pixel readout operations, a pixel row in image pixel array 32 may be selected using row control circuitry 22 and image data associated with image pixels of that pixel row may be read out by column control and readout circuitry 84 on column lines 24.

In addition to the analog-to-digital converters, clamp input transistors, and VLN transistors shown in FIG. 3, column control and readout circuitry 84 may include column circuitry such as column amplifiers for amplifying signals read out from array 32, sample and hold circuitry for sampling and storing signals read out from array 32, column memory for storing the read out signals and any other desired data, and/or any other desired components. Column control and readout circuitry 84 may output digital pixel values to control and processing circuitry 82.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Over the lifetime of the image sensor, the image sensor may be prone to failure. Therefore, image sensor 14 in FIG. 3 may include verification circuitry 45 for testing the functionality of the image sensor. In some embodiments, verification circuitry 45 may include dummy pixels 47. Dummy pixels 47 may include some or all components of an imaging pixel from array 32 (even though the dummy pixels are not configured to measure incident light). Verification circuitry 45 may also include logic circuitry, comparison circuitry, and latch circuitry if desired.

If desired, row control circuitry 22 and pixel array 32 may be integrated together in a single integrated circuit (as an example). Alternatively, row control circuitry 22 and pixel array 32 may be implemented in separate semiconductor substrates. In one example, as shown in FIG. 3, pixel array 32 and verification circuitry 45 may be formed in a first chip 92, whereas the additional circuitry (e.g., row control circuitry 22, clamp input generator 20, ADCs 26, etc.) is formed in a second chip 94. The first chip may sometimes be referred to as a pixel sensor chip. The second chip may be referred to as an application-specific integrated circuit (ASIC) chip. The two chips may be connected by conductive interconnect layers (e.g., hybrid bonds and/or bonds at peripheral contact pads).

In the aforementioned described embodiment where image sensor 14 is implemented using stacked chips, it may be desirable for verification circuitry (e.g., verification circuitry 45 in the pixel sensor chip) to have only nMOS (n-channel metal-oxide semiconductor) transistors. Including only nMOS transistors in the pixel sensor chip (and no pMOS transistors) may reduce the amount of implant steps to form the chip during manufacturing. Additionally, forming the pixel sensor chip with only nMOS transistors (and no pMOS transistors) may reduce contamination. Therefore, it may be desirable to use only nMOS transistors in the pixel sensor chip.

The row control circuitry 22 may provide row control signals to the image pixels for capturing image data (e.g., over control paths 86). The verification circuitry may also receive the row control signals from row control circuitry 22. The verification circuitry may identify predetermined ranges of acceptable row control signal magnitudes based on the type of row control signal and the mode of operation of the image sensor. When the output test signal is not within the determined range, an error flag may be output from the image sensor.

ASIC chip 94 may also include one or more p-channel metal-oxide semiconductor (pMOS) current sources 96 (e.g., current sources formed from one or more pMOS transistors). The pMOS current sources 96 may be used as the active load for verification circuitry 45 in the pixel sensor chip. However, to ensure that only nMOS structures are formed in pixel sensor chip 92, the pMOS current sources 96 are formed in the ASIC chip 94. Row select signals from row control circuitry 22 may be used as a power on signal for verification circuitry 45 (e.g., the row select signal may be asserted in the row being tested). For example, the row select control signal (RS) is asserted to enable testing using a given row of verification circuitry. A current source from the ASIC chip (e.g., from current source 96) may be provided only to a row that is enabled by the assertion of the row select control signal. Activating only the verification circuitry of a selected row may reduce power consumption during testing.

The verification circuitry may have an nMOS source follower transistor and an nMOS row select transistor. Since the verification circuitry is within chip 92, no pMOS structures are formed in the verification circuitry.

Figure 4:
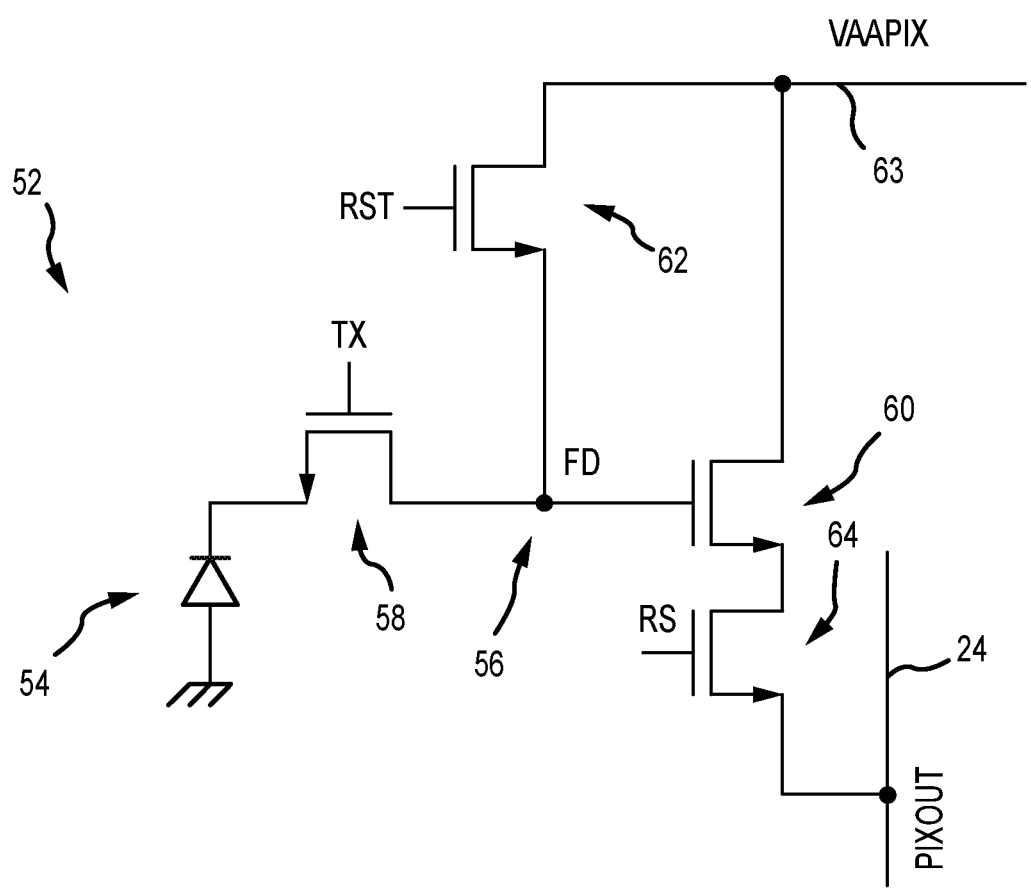
FIG. 4 is a circuit diagram of an illustrative pixel that may be included in an image sensor such as the image sensor of FIG. 3 in accordance with an embodiment.

FIG. 4 is a circuit diagram showing the structure of the pixels 52 in FIG. 3. As shown in FIG. 4, pixel 52 includes a photodiode 54, a floating diffusion region (FD) 56, and a transfer transistor 58. Photodiode 54 may sense light by converting impinging photons into electrons or holes. Transfer transistor 58 may be asserted to transfer charge from photodiode 54 to floating diffusion region 56. A row select transistor 64 is interposed between the drain of the source follower transistor 60 and column output line 24. To read out charge from floating diffusion region 56, the row select transistor 64 is asserted and the voltage corresponding to the charge at the floating diffusion region is read out on column output line 24. The floating diffusion region 56 is coupled to source follower transistor 60 and reset transistor 62. The source follower transistor is also coupled to a bias voltage supply line 63 that provides a bias voltage $V_{AAPIX}$.

After charge to voltage conversion is completed and the resulting signal transferred out from the pixels (by asserting row select transistor 64), the pixel may be reset by asserting reset transistor 62 and coupling floating diffusion region to bias voltage supply line 63. Because pixel 52 is formed in pixel sensor ship 92, all of the transistors in pixel 52 may be nMOS transistors. In other words, transfer transistor 58, reset transistor 62, source follower transistor 60, and row select transistor 64 are all nMOS transistors. The pixel structure shown in FIG. 4 is merely illustrative. If desired, pixel 52 may include any other desired pixel components in any desired configurations (e.g., one or more storage diodes, one or more storage capacitors, an anti-blooming transistor, one or more dual conversion gain transistors, one or more dual conversion gain capacitors, etc.).

Figure 5:
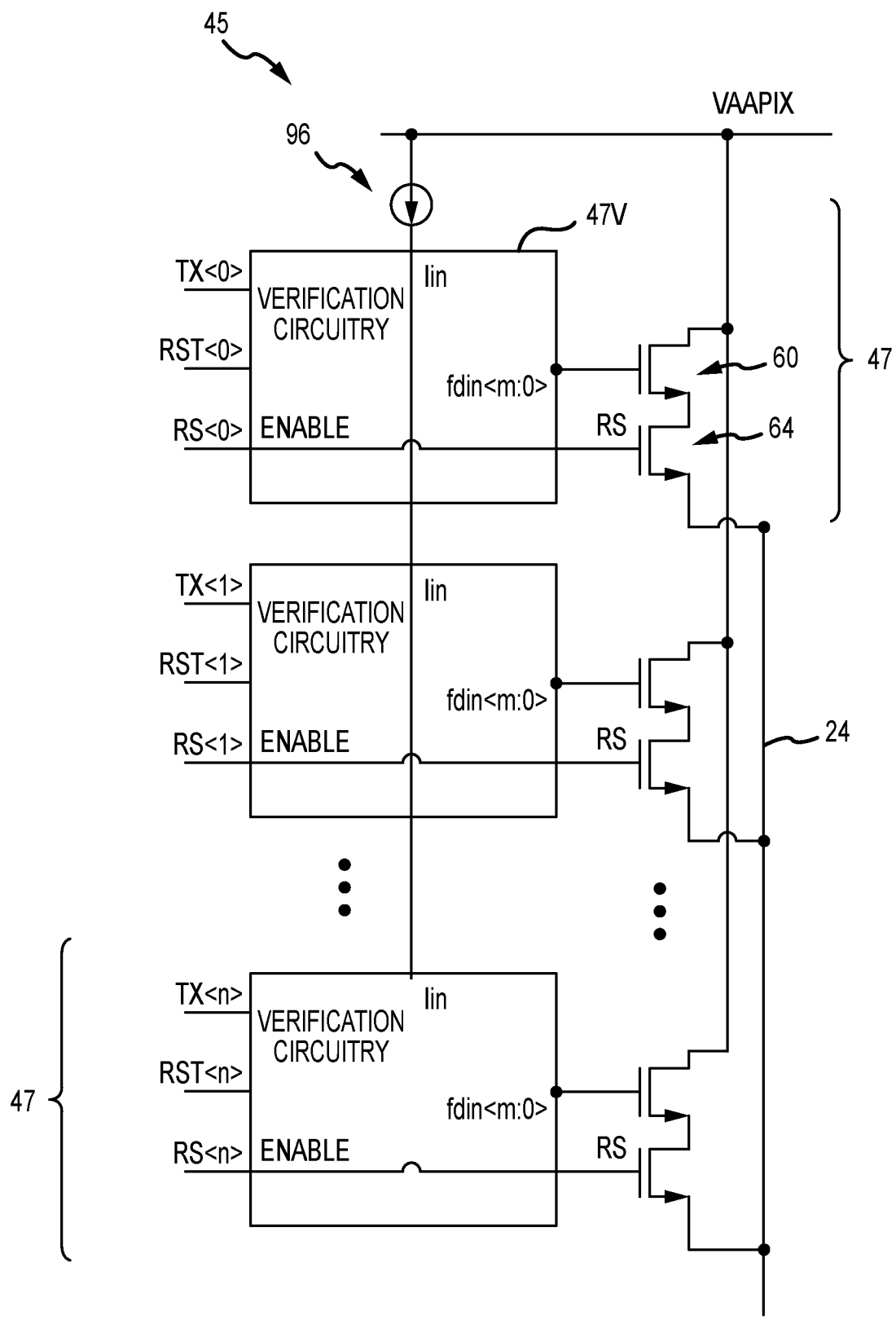
FIG. 5 is a circuit diagram of illustrative verification circuitry that may be included in an image sensor such as the image sensor of FIG. 3 in accordance with an embodiment.

FIG. 5 is a circuit diagram showing the structure of verification circuitry 45 (including dummy pixels 47) in FIG. 3. As shown in FIG. 5, each dummy pixel 47 may include a source follower transistor 60 that is coupled between $V_{AAPIX}$ and row select transistor 64. Row select transistor 64 is coupled between source follower transistor 60 and column line 24. Each dummy pixel may also include corresponding verification circuitry 47V (sometimes referred to as verification circuit 47V or verification circuitry portion 47V). Verification circuitry 47V may receive control signals from row control circuitry 22 such as transfer control signal TX, reset control signal RST, and row select control signal RS. Verification circuitry 47V may also be coupled to a pMOS current source 96. The pMOS current source 96 may provide the current source for verification circuitry 47V. However, to ensure that only nMOS structures are formed in pixel chip 92 the pMOS current source is formed in ASIC chip 94 whereas verification circuitry 47V and the rest of each dummy pixel 47 is formed in pixel chip 92. As previously mentioned, row select signal RS acts as an enable signal for verification circuitry 47V. Therefore, only pixels 47 in which row select control signal RS is asserted will receive the supply current from pMOS current source 96.

To ensure that only nMOS structures are formed in pixel chip 92, source follower transistor 60 and row select transistor 64 of each dummy pixel 47 are formed from nMOS transistors. Additionally, the verification circuitry of each dummy pixel is formed from only nMOS structures.

The verification circuitry 47V of each dummy pixel may also include logic circuitry, comparison circuitry, and/or latch circuitry if desired (e.g., an NAND gate, a NOR gate, a SR latch, etc.). The dummy pixels may be used to perform numerous tests of control signals and functionality within image sensor 14. For example, the dummy pixels may be used to perform a reset signal check. In the reset signal check, the reset signal is brought low during analog-to-digital conversion. If the reset signal is low, the FDIN node will be low during analog-to-digital conversion. If the reset signal is not low, a failure has occurred and the FDIN node will be high during analog-to-digital conversion. The reset signal check may use an NAND gate in the verification circuitry. The dummy pixels may also be used to perform a row address check. The row address check may use an NAND gate, a NOR gate, and a SR latch in the verification circuitry. The dummy pixels may also be used to perform a transfer control signal, reset control signal, row select control signal propagation check (sometimes referred to as a TX, RST, RS propagation check) with a FD binning mode. The dummy pixels may also be used to perform a dual conversion gain (DCG) mode check.

The outputs of the dummy pixels in a respective column are provided to column line 24. Column line 24 may be connected to a clamping transistor, VLN transistor, and analog-to-digital convertor as shown in FIG. 3. The ADC output may be output as either image data or a register output. The ADC output may be checked (e.g., by control and processing circuitry 82) to determine whether it is within a pre-determined range (e.g., the pre-determine range expected for the given test). When the output is not within the determined range, an error flag may be output from the image sensor (e.g., noting a failure has occurred). In general, the verification circuitry may identify predetermined ranges of acceptable control signal magnitudes based on the type or control signal (e.g., TX, RST, RS, or DCG) and the mode of operation of the image sensor. One row image pattern for each one or some columns may be output. To check row address selected by row decoder, unique row image pattern for each one or some rows may be outputted from ADC connected to dummy pixel columns.

In the example of FIG. 5, one column of dummy pixels is shown. This example is merely illustrative. If desired, additional columns of dummy pixels may be included in verification circuitry 45. Each column of dummy pixels may be coupled to a respective pMOS current source 96 in ASIC chip 94. In an alternate embodiment, two or more pMOS current sources may be coupled to dummy pixels in a given column.

The image sensors shown in FIG. 3 may be split between substrates in any desired manner. In one illustrative example (shown in FIG. 3), pixel array 32 and verification circuitry 45 may be formed in a first substrate (e.g., pixel sensor chip 92) while row control circuitry 22, clamp input generator 20, ADCs 26, etc. may be formed in a second substrate (e.g., ASIC chip 94). The first and second substrates may be connected by hybrid and/or peripheral bonds as shown in FIG. 2. In this example, either of the first and second substrates may include verification circuitry. However, the verification circuitry in the first substrate (with pixel and dummy pixel components) may include only nMOS transistors as described in connection with FIGS. 3 and 5.

In another illustrative example, pixel array 32 may be formed using two substrates, with at least the photodiodes in a first substrate and at least the row select transistor in a second substrate. Row control circuitry 22, clamp input generator 20, ADCs 26, etc. may be formed in a third substrate. The first, second, and third substrates may be connected by hybrid and/or peripheral bonds. In this example, any of the first, second, and third substrates may include verification circuitry. However, the verification circuitry in the first and/or second substrate (with pixel and dummy pixel components) may include only nMOS transistors as described in connection with FIGS. 3 and 5. In general, array 32, row control circuitry 22, column control and readout circuitry 84, and control and processing circuitry 82 may be split between two or more stacked substrates in any desired manner.

In various embodiments, an image sensor may include first and second substrates, an array of imaging pixels in the first substrate, each imaging pixel having a photodiode, row control circuitry in the second substrate that is configured to provide row control signals to the array of imaging pixels, and verification circuitry in the first substrate that receives the row control signals from the row control circuitry. The first substrate may include a plurality of n-channel metal-oxide semiconductor transistors and may not include any p-channel metal-oxide semiconductor transistors.

The image sensor may also include a current source coupled to the verification circuitry. The current source may be a p-channel metal-oxide semiconductor current source. The p-channel metal-oxide semiconductor current source may be formed in the second substrate. The verification circuitry may include a plurality of dummy pixels, each dummy pixel may have a respective verification circuitry portion, and each dummy pixel may receive a row select control signal from the row control circuitry that selectively enables the respective verification circuit portion for that dummy pixel. Only the verification circuitry portions of dummy pixels that are enabled by the row select control signal may receive current from the current source.

Each imaging pixel may include a floating diffusion region, a transfer transistor coupled between the photodiode and the floating diffusion region, a source follower transistor coupled to the floating diffusion region, a reset transistor coupled to the floating diffusion region, and a row select transistor coupled to the source follower transistor. The plurality of dummy pixels may include at least one column of dummy pixels and each column of dummy pixels in the at least one column of dummy pixels may be coupled to a respective column output line. Each column output line may be coupled to a respective analog-to-digital converter.

In various embodiments, an image sensor may include first and second substrates, an array of imaging pixels in the first substrate arranged in a plurality of rows and a plurality of columns, a plurality of dummy pixels in the first substrate arranged in a plurality of rows and at least one column, and row control circuitry in the second substrate. The row control circuitry may be configured to provide a respective control signal to each row of imaging pixels and each row of dummy pixels, the control signal may selectively enable verification circuitry in each dummy pixel, and the first substrate may not include any p-channel metal-oxide semiconductor transistors.

The image sensor may also include a current source coupled to the verification circuitry in each dummy pixel in a first column of dummy pixels. The current source may include at least one p-channel metal-oxide semiconductor transistor. The current source may be formed in the second substrate. Only the verification circuitry that has been enabled by the control signal may receive current from the current source. Each imaging pixel may include a floating diffusion region, a transfer transistor coupled between the photodiode and the floating diffusion region, a source follower transistor coupled to the floating diffusion region, a reset transistor coupled to the floating diffusion region, and a row select transistor coupled to the source follower transistor. A gate of the row select transistor of each imaging pixel may receive the control signal from the row control circuitry.

In various embodiments, an image sensor may include a first substrate that includes an array of imaging pixels that includes a plurality of n-channel metal-oxide semiconductor transistors and does not include any p-channel metal-oxide semiconductor transistors and verification circuitry that includes a plurality of n-channel metal-oxide semiconductor transistors and does not include any p-channel metal-oxide semiconductor transistors and a second substrate that is overlapped by the first substrate and that includes a current source coupled to the verification circuitry that includes at least one p-channel metal-oxide semiconductor transistor and row control circuitry in the second substrate. The row control circuitry may be configured to provide a first row control signal to a first row of imaging pixels in the array of imaging pixels and a first portion of the verification circuitry and the first row control signal may control whether the first portion of the verification circuitry receives current from the current source.

The first row control signal may be provided to a gate of a row select transistor in each imaging pixel of the first row of imaging pixels. The row control circuitry may be configured to provide a second row control signal to the first row of imaging pixels and the first portion of the verification circuitry and the second row control signal may be provided to a gate of a transfer transistor in each imaging pixel of the first row of imaging pixels. The row control circuitry may be configured to provide a third row control signal to the first row of imaging pixels and the first portion of the verification circuitry and the third row control signal may be provided to a gate of a reset transistor in each imaging pixel of the first row of imaging pixels.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor comprising:
first and second substrates;
an array of imaging pixels in the first substrate, wherein each imaging pixel comprises a photodiode;
row control circuitry in the second substrate, wherein the row control circuitry is configured to provide row control signals to the array of imaging pixels; and
verification circuitry in the first substrate that receives the row control signals from the row control circuitry, wherein the first substrate includes a plurality of n-channel metal-oxide semiconductor transistors and does not include any p-channel metal-oxide semiconductor transistors.

2. The image sensor defined in claim 1, further comprising:
a current source coupled to the verification circuitry.

3. The image sensor defined in claim 2, wherein the current source is a p-channel metal-oxide semiconductor current source.

4. The image sensor defined in claim 3, wherein the p-channel metal-oxide semiconductor current source is formed in the second substrate.

5. The image sensor defined in claim 2, wherein the verification circuitry comprises a plurality of dummy pixels, wherein each dummy pixel has a respective verification circuitry portion, and wherein each dummy pixel receives a row select control signal from the row control circuitry that selectively enables the respective verification circuit portion for that dummy pixel.

6. The image sensor defined in claim 5, wherein only the verification circuitry portions of dummy pixels that are enabled by the row select control signal receive current from the current source.

7. The image sensor defined in claim 5, wherein each imaging pixel comprises a floating diffusion region, a transfer transistor coupled between the photodiode and the floating diffusion region, a source follower transistor coupled to the floating diffusion region, a reset transistor coupled to the floating diffusion region, and a row select transistor coupled to the source follower transistor.

8. The image sensor defined in claim 5, wherein the plurality of dummy pixels includes at least one column of dummy pixels and wherein each column of dummy pixels in the at least one column of dummy pixels is coupled to a respective column output line.

9. The image sensor defined in claim 8, wherein each column output line is coupled to a respective analog-to-digital converter.

10. An image sensor comprising:
first and second substrates;
an array of imaging pixels in the first substrate arranged in a plurality of rows and a plurality of columns;
a plurality of dummy pixels in the first substrate arranged in a plurality of rows and at least one column; and
row control circuitry in the second substrate, wherein the row control circuitry is configured to provide a respective control signal to each row of imaging pixels and each row of dummy pixels, wherein the control signal selectively enables verification circuitry in each dummy pixel, and wherein the first substrate does not include any p-channel metal-oxide semiconductor transistors.

11. The image sensor defined in claim 10, further comprising:
a current source coupled to the verification circuitry in each dummy pixel in a first column of dummy pixels.

12. The image sensor defined in claim 11, wherein the current source includes at least one p-channel metal-oxide semiconductor transistor.

13. The image sensor defined in claim 12, wherein the current source is formed in the second substrate.

14. The image sensor defined in claim 13, wherein only the verification circuitry that has been enabled by the control signal receives current from the current source.

15. The image sensor defined in claim 14, wherein each imaging pixel comprises a floating diffusion region, a transfer transistor coupled between the photodiode and the floating diffusion region, a source follower transistor coupled to the floating diffusion region, a reset transistor coupled to the floating diffusion region, and a row select transistor coupled to the source follower transistor.

16. The image sensor defined in claim 15, wherein a gate of the row select transistor of each imaging pixel receives the control signal from the row control circuitry.

17. An image sensor comprising:
a first substrate, wherein the first substrate comprises:
an array of imaging pixels that includes a plurality of n-channel metal-oxide semiconductor transistors and does not include any p-channel metal-oxide semiconductor transistors; and
verification circuitry that includes a plurality of n-channel metal-oxide semiconductor transistors and does not include any p-channel metal-oxide semiconductor transistors; and
a second substrate that is overlapped by the first substrate, wherein the second substrate comprises:
a current source coupled to the verification circuitry that includes at least one p-channel metal-oxide semiconductor transistor; and
row control circuitry in the second substrate, wherein the row control circuitry is configured to provide a first row control signal to a first row of imaging pixels in the array of imaging pixels and a first portion of the verification circuitry and wherein the first row control signal controls whether the first portion of the verification circuitry receives current from the current source.

18. The image sensor defined in claim 17, wherein the first row control signal is provided to a gate of a row select transistor in each imaging pixel of the first row of imaging pixels.

19. The image sensor defined in claim 18, wherein the row control circuitry is configured to provide a second row control signal to the first row of imaging pixels and the first portion of the verification circuitry and wherein the second row control signal is provided to a gate of a transfer transistor in each imaging pixel of the first row of imaging pixels.

20. The image sensor defined in claim 19, wherein the row control circuitry is configured to provide a third row control signal to the first row of imaging pixels and the first portion of the verification circuitry and wherein the third row control signal is provided to a gate of a reset transistor in each imaging pixel of the first row of imaging pixels.

* * * * *